US010009064B2

(12) United States Patent
Lu et al.

(10) Patent No.: US 10,009,064 B2
(45) Date of Patent: Jun. 26, 2018

(54) METHOD FOR DIFFERENTIATING POWER DISTRIBUTION AREAS AND PHASES BY USING VOLTAGE CHARACTERISTICS

(71) Applicants: JIANGSU LINYANG ENERGY CO., LTD., Qidong, Jiangsu (CN); NANJING LINYANG POWER TECH CO., LTD., Nanjing, Jiangsu (CN)

(72) Inventors: Hanxi Lu, Qidong (CN); Yan Zhu, Qidong (CN)

(73) Assignees: JIANGSU LINYANG ENERGY CO., LTD., Qidong (CN); NANJING LINYANG POWER TECH CO., LTD., Nanjing (CN)

(*) Notice: Subject to any disclaimer, the term of this patent is extended or adjusted under 35 U.S.C. 154(b) by 0 days. days.

(21) Appl. No.: 15/326,947

(22) PCT Filed: Dec. 18, 2014

(86) PCT No.: PCT/CN2014/094156
§ 371 (c)(1),
(2) Date: Jan. 17, 2017

(87) PCT Pub. No.: WO2016/008263
PCT Pub. Date: Jan. 21, 2016

(65) Prior Publication Data
US 2017/0207818 A1    Jul. 20, 2017

(30) Foreign Application Priority Data
Jul. 17, 2014   (CN) .......................... 2014 1 0343074

(51) Int. Cl.
*H04B 3/54* (2006.01)
*H04B 3/32* (2006.01)
*G01R 35/00* (2006.01)

(52) U.S. Cl.
CPC ................. *H04B 3/54* (2013.01); *H04B 3/32* (2013.01); *G01R 35/005* (2013.01); *H04B 2203/5433* (2013.01)

(58) Field of Classification Search
CPC .............. H04B 3/54; H04B 2203/5466; H04B 2203/542; H04B 2203/5433; G01R 19/2513
See application file for complete search history.

(56) References Cited

U.S. PATENT DOCUMENTS

2015/0253367 A1* 9/2015 Flammer, III ......... G01R 25/00
324/76.77

FOREIGN PATENT DOCUMENTS

CN    103078666 A    5/2013
CN    104092481 A    10/2014

OTHER PUBLICATIONS

Apr. 22, 2015 International Search Report issued in International Patent Application No. PCT/CN2014/094156.
(Continued)

*Primary Examiner* — David S Huang
(74) *Attorney, Agent, or Firm* — Oliff PLC

(57) ABSTRACT

A method for differentiating power distribution areas and phases by using voltage characteristics, where the method includes performing similarity comparison on a voltage curve of a node to be determined and a voltage curve recorded by a concentrator to determine whether the node belongs to a current power distribution area. Using the method for identifying power distribution areas and phases according to voltage characteristics, the problem of inaccurate electric power measurement due to power distribution area archive errors, communication crosstalk, and others is effectively resolved, a collection success rate and meter reading stability of a power distribution area are improved, a line loss rate of a power distribution area is moderately (Continued)

reduced, correctness of ammeter archive information of an SG186 system is ensured, occurrences of power distribution area crossing of carrier communications and ammeter archive errors are eradicated, and delicacy management of a marketing system is realized.

8 Claims, 6 Drawing Sheets

(56) References Cited

OTHER PUBLICATIONS

Apr. 22, 2015 Written Opinion of the International Searching Authority issued in International Patent Application No. PCT/CN2014/094156.

* cited by examiner

METHOD FOR DIFFERENTIATING POWER DISTRIBUTION AREAS AND PHASES BY USING VOLTAGE CHARACTERISTICS

BACKGROUND

Technical Field

The present invention relates to the problem of identification of power distribution areas and phases in a centralized meter reading system in the power distribution field, and in particular, to a method for differentiating power distribution areas and phases by using voltage characteristics.

Related Art

With continuous deepening reforms of power systems, especially in the process of the wide building of smart grids and various breakthroughs, it is also found that the accuracy of archives of power distribution areas is a strong guarantee for the construction of smart grids. An archive that is not for a current power distribution area (generally that for a neighboring power distribution area) may be loaded into a concentrator for the current power distribution area due to an archive assignment error. If a power line carrier communications technology is utilized, a network typology structure in the technology has natural relevance to a power distribution area structure. However, due to the effect of signal crosstalk among power distribution areas, the power distribution areas cannot be differentiated with an effective means, and can only be differentiated by strength of a communication signal or a number of repeating levels, bringing a high misjudgment rate. Although ammeter covering power distribution areas may be read in some cases, the problem of unsteady meter reading still arises. If a micro-power wireless communications technology is utilized, a network typology structure in the technology does not have any relevance to a power distribution area structure, and therefore power distribution areas cannot be differentiated at all. If power distribution areas cannot be differentiated, errors in an archive cannot be found inevitably, thereby affecting the accuracy of line loss computation of a power distribution area.

Currently, in a rural-urban fringe area or a cable-buried community where line connection is complex, there is no particular means to check and differentiate transformer areas without interruption of power supply, actual power distribution area relationships cannot be reflected by construction drawings, and the problem of cross-power-distribution-area meter reading due to signal coupling of neighboring power distribution areas cannot be effectively resolved by means of current communications technologies. A most direct solution for resolving the ammeter archive problem is cutting off power supply for a power distribution area by switching off a transformer to be tested, so that power supply for all users served by the transformer is cut off, and the users for whom the transformer supplies power can be determined by checking which users still have power supply. This solution is direct and accurate. However, a notification needs to be issued a few days before an outrage, and a lot of manpower and resources are required, which is inefficient and inconvenient, and prolongs a testing cycle and affects a work progress, and results in users' complaints if the outrage lasts excessively long. A power distribution area differentiation apparatus is developed to resolve the foregoing problems. The power distribution area differentiation apparatus is capable of rapidly and accurately detecting a power distribution area and a phase of an ammeter or other terminal equipment. However, the power distribution area differentiation apparatus is expensive and needs to be installed and tested. Moreover, if each ammeter or terminal needs to be differentiated, workload and costs are huge. Therefore, to improve the accuracy, timeliness, and automation level of electric energy measurement, meter reading, and electric charge accounting and charging, a new solution needs to be proposed.

SUMMARY

To automatically correct power distribution area archive errors, avoid unsteadiness of meter reading due to power distribution area crosstalk of carrier communications, overcome the shortcoming of incapability of differentiating power distribution areas through wireless communications, and improve accuracy of line loss statistics of a power distribution area, the present invention proposes a method for differentiating power distribution areas and phases by using voltage characteristics. According to the method, by collecting voltage data of a power distribution area and performing curve analysis on collected voltages, it is found that different power distribution areas and phases have different voltage characteristics and a same power distribution area and phase has a similar voltage characteristic, and thereby a method for differentiating power distribution areas and phases according to voltage characteristics is provided.

Technical solutions of the present invention are:

A method for differentiating power distribution areas and phases by using voltage characteristics, where the method includes performing similarity comparison on a voltage curve of a node to be determined and a voltage curve recorded by a concentrator to determine whether the node belongs to a current power distribution area.

Specific steps of the method are:

step a: a concentrator continuously collects a voltage curve of a node to be determined and stores the voltage curve;

step b: perform similarity comparison on the voltage curve recorded by the concentrator and the voltage curve obtained in step a;

step c: if a similarity absolute value is greater than a set value, determine that the node belongs to a current power distribution area, and if the similarity absolute value is less than or equal to the set value, kick out the node so that the node becomes a free node; and step d: repeat steps a to c, until all nodes to be determined are traversed.

Preferably, the method further includes:

step e: search for a free node, and perform similarity comparison with the voltage curve recorded by the concentrator;

step f: if a similarity absolute value is greater than the set value, determine that the node belongs to the current power distribution area, and if the similarity absolute value is less than or equal to the set value, kick the node into a free node library; and step g: repeat steps e to f, until all free nodes are traversed.

As a preferred similarity comparison method, a method for the similarity comparison uses a Pearson correlation coefficient algorithm.

Preferably, the set value is 0.6 to 0.8.

Preferably, the set value is 0.8.

Beneficial effects of the present invention:

By means of the method for identifying power distribution areas and phases according to voltage characteristics, the problem of inaccurate electric power measurement due to power distribution area archive errors, communication crosstalk, and others is effectively resolved, a collection success rate and meter reading stability of a power distribution area are improved, a line loss rate of a power distribution area is moderately reduced, correctness of ammeter archive information of an SG186 system is ensured, occurrences of power distribution area crossing of carrier communications and ammeter archive errors are eradicated, and delicacy management of a marketing system is realized.

Compared with other similarity algorithms, an accuracy rate can reach up to greater than 99% by using a Pearson correlation coefficient algorithm. Power distribution area archive errors can be effectively automatically corrected, unsteadiness of meter reading due to power distribution area crosstalk of carrier communications can be avoided, the shortcoming of incapability of differentiating power distribution areas through wireless communications can be overcome, and accuracy of line loss statistics of a power distribution area can be improved.

DETAILED DESCRIPTION

The present invention is further described below with reference to embodiments, but the protection scope of the present invention is not limited thereto.

The present invention is described in detail below with reference to the accompanying drawings and specific examples.

Figure 2:
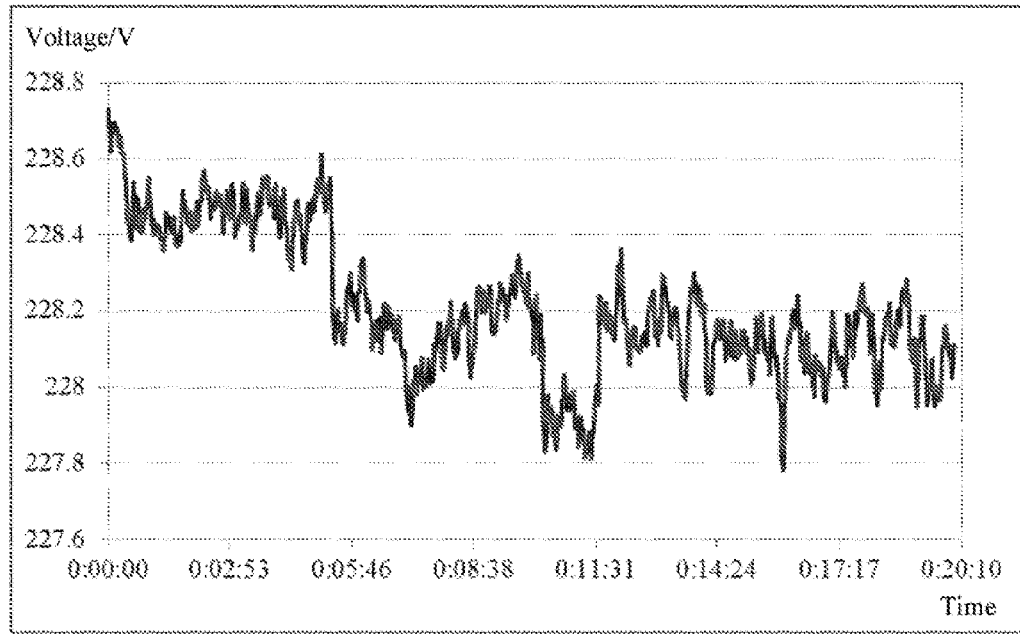
FIG. 2(a) is a voltage characteristic curve of a phase A of a power distribution area that is collected by a first concentrator.
FIG. 2(b) is a voltage characteristic curve of the phase A of the power distribution area that is collected by a second concentrator.
Figure 2:
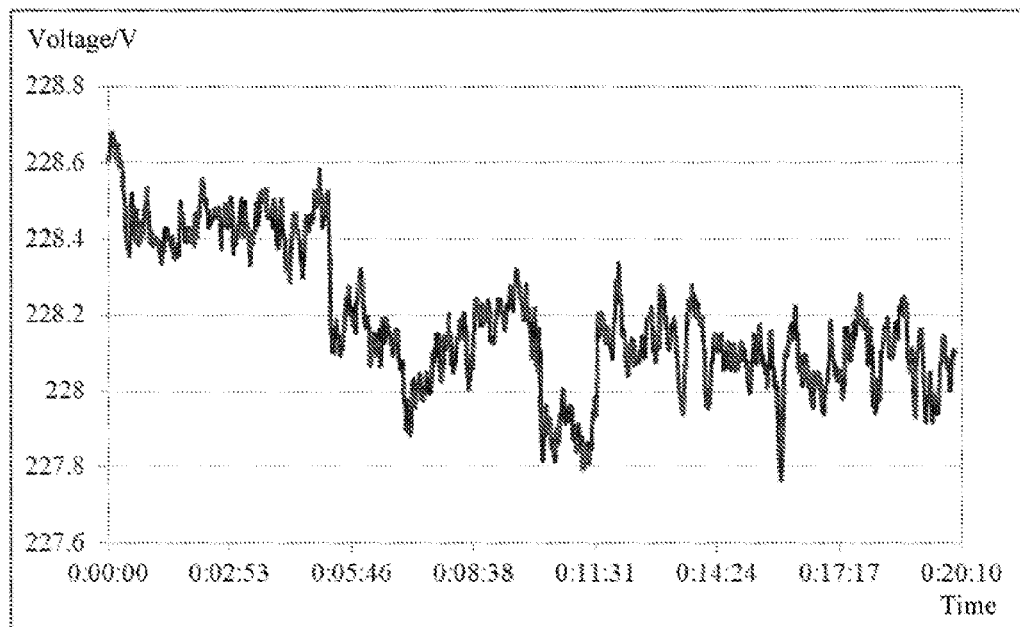
Figure 3:
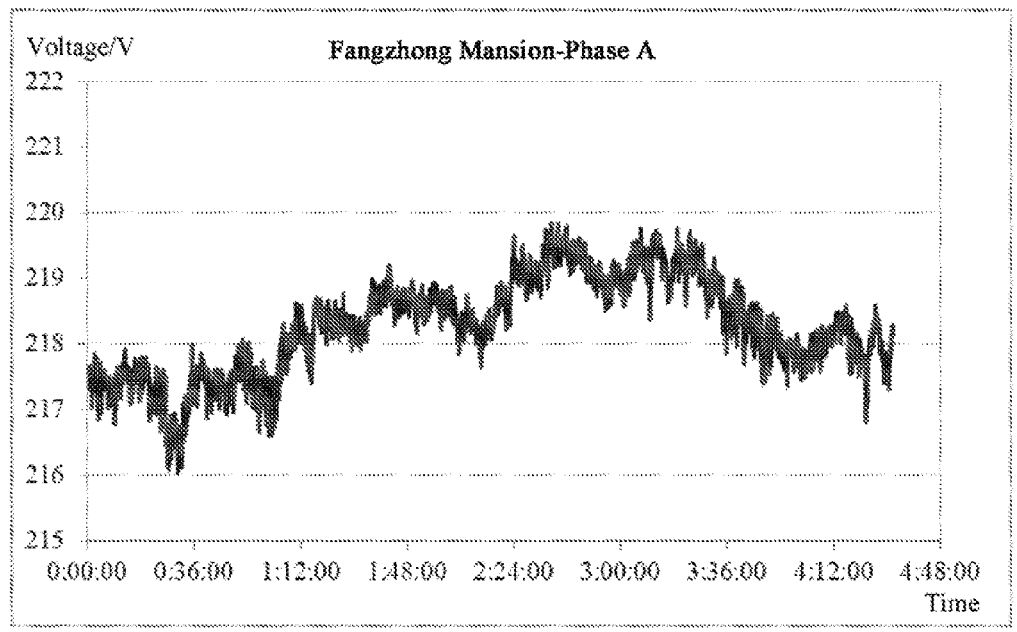
FIG. 3(a) is a voltage characteristic curve of a phase A of Fangzhong Mansion that is collected by a concentrator.
FIG. 3(b) is a voltage characteristic curve of a phase B of Fangzhong Mansion that is collected by the concentrator.
FIG. 3(c) is a voltage characteristic curve of a phase C of Fangzhong Mansion that is collected by the concentrator.
Figure 3:
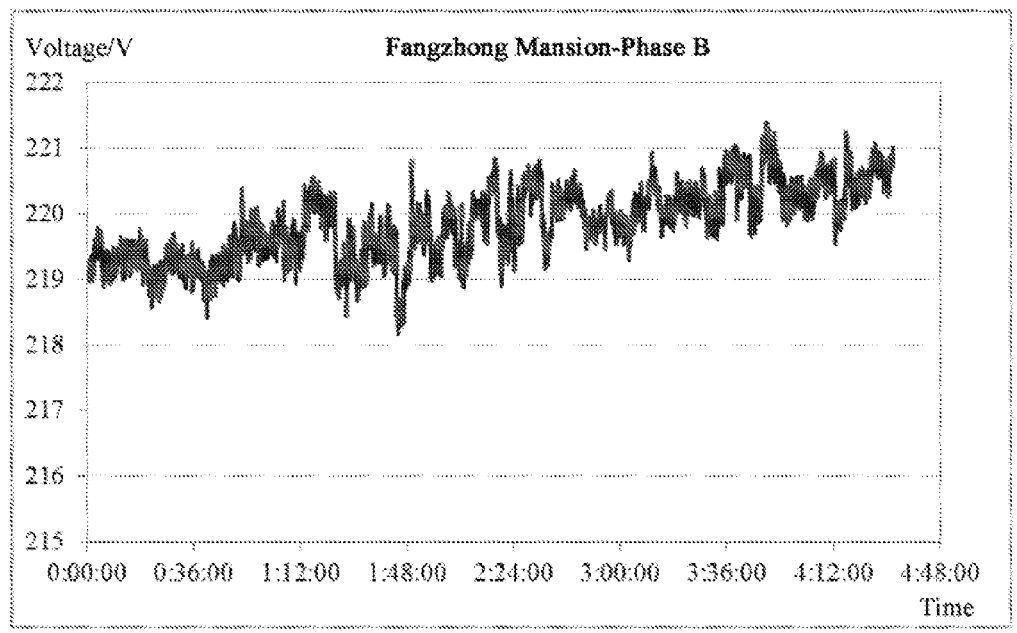
Figure 3:
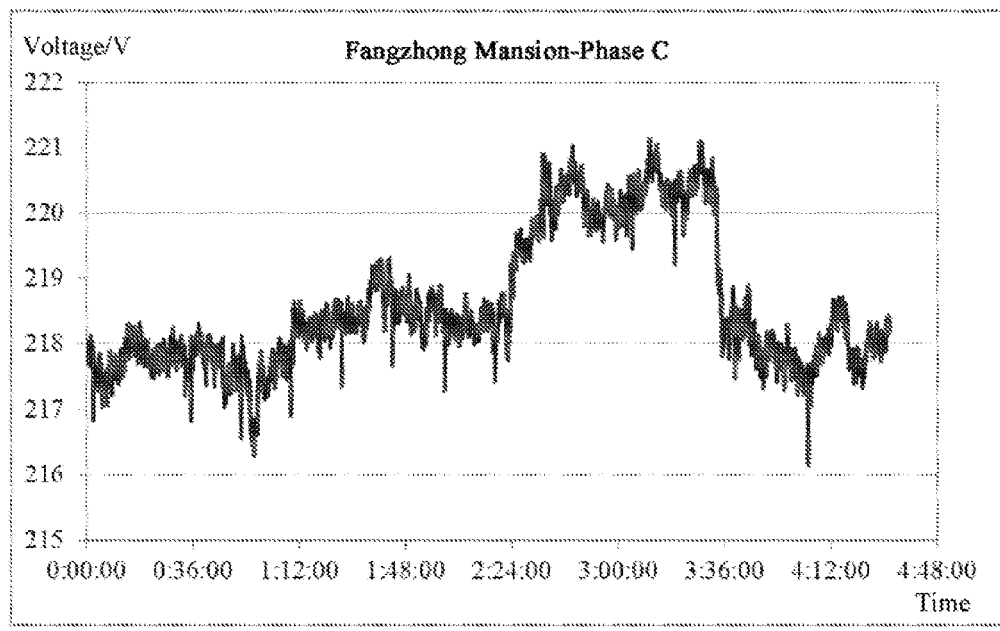
Figure 4:
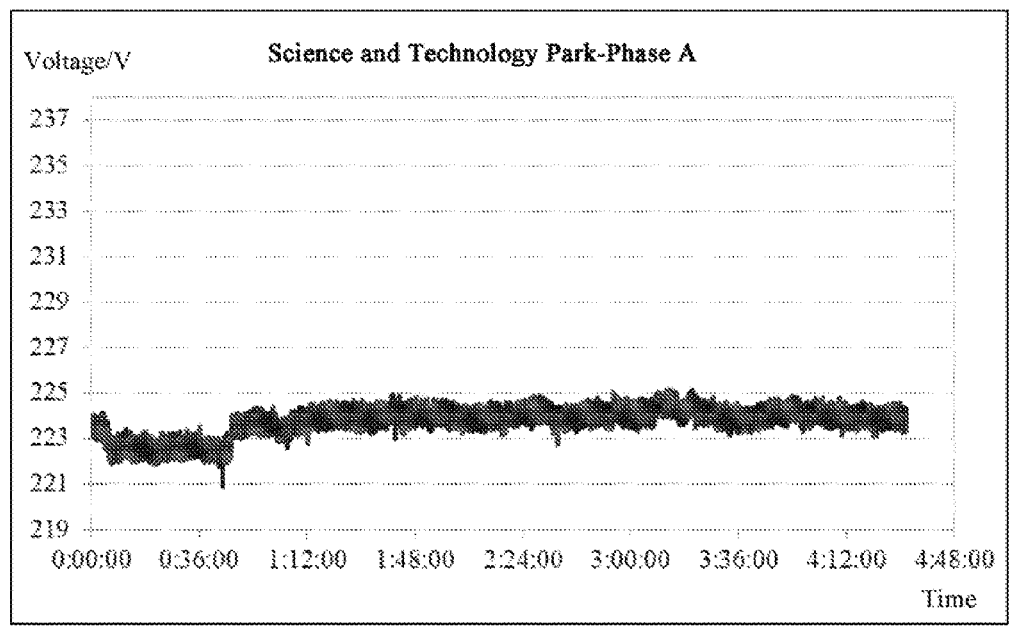
FIG. 4(a) is a voltage characteristic curve of a phase A of Xincheng Science and Technology Park that is collected by the concentrator.
FIG. 4(b) is a voltage characteristic curve of a phase B of Xincheng Science and Technology Park that is collected by the concentrator.
FIG. 4(c) is a voltage characteristic curve of a phase C of Xincheng Science and Technology Park that is collected by the concentrator.
Figure 4:
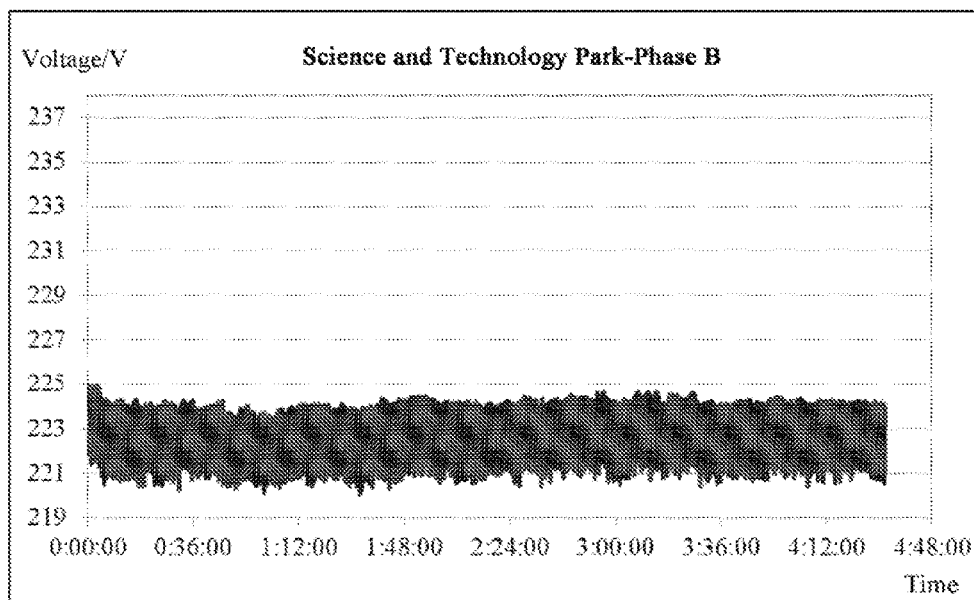
Figure 4:
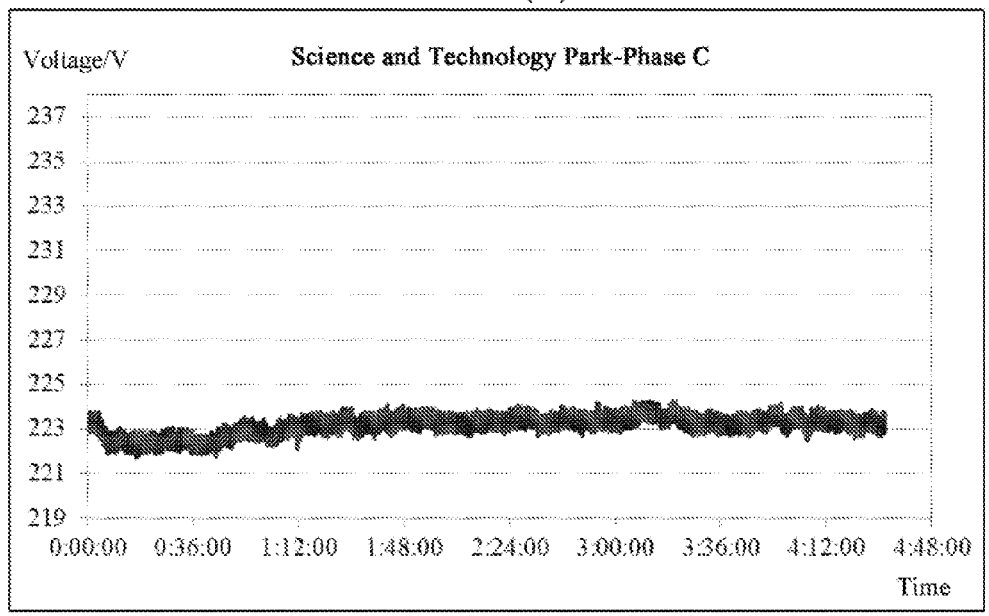
Figure 5:
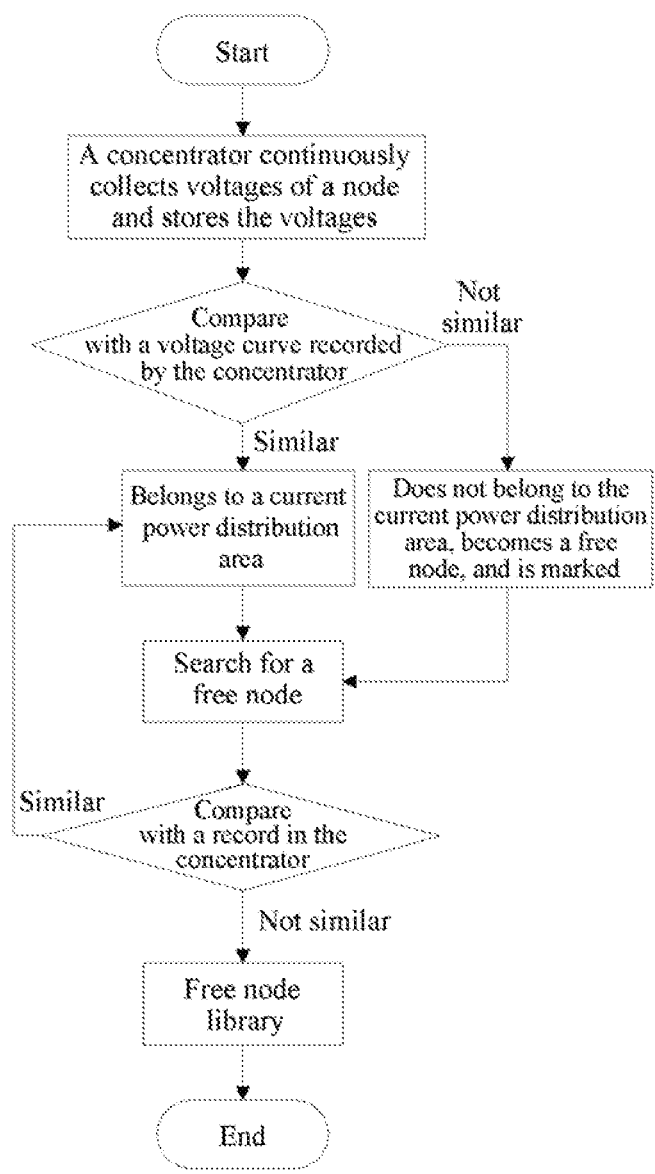
FIG. 5 is a flowchart of a method for differentiating power distribution areas and phases by using voltage characteristic curves.

By using the specific examples, the present invention explains that different power distribution areas and phases have different voltage characteristics and a same power distribution area and phase has a similar voltage characteristic. Two actual power distribution areas, that is, (1) Fangzhong Mansion and (2) Xincheng Science and Technology Park, are selected. Voltage data of the two power distribution areas is continuously collected and stored by using a concentrator. Corresponding voltage characteristic curves drawn according to the collected data are respectively shown in FIG. 2, FIG. 3, and FIG. 4. FIG. 2 gives voltage characteristic curves of a same power distribution area and a same phase that are respectively collected by using two concentrators. FIG. 3 and FIG. 4 respectively give voltage characteristic curves of different power distribution areas and different phases that are collected by using a concentrator. It can be known from FIG. 2 to FIG. 4 that, different power distribution areas and phases have respective unique voltage characteristics, while a same power distribution area and phase has a similar voltage characteristic.

According to the foregoing conclusion, voltage curves of ammeters that are recorded by a concentrator may be compared with a voltage curve that is collected by the concentrator. If an absolute value of a similarity between a voltage curve of an ammeter and the voltage curve collected by the concentrator exceeds a set similarity threshold, it is determined that the ammeter does not belong to a current power distribution area and the ammeter is kicked out so that the ammeter becomes a free node, and the ammeter that is kicked out is marked, in an archive of the power distribution area, as an ammeter that does not belong to the current power distribution area. A node in a free state is searched for and compared with the archive in the concentrator, and a free node that has a similarity falling within a set range and has not been added to a free node library or a free node that has been kicked out for a specified time is added to the free node library. The foregoing process is repeated until there is no free node when power distribution area allocation is ended. Similarity verification of a voltage characteristic curve is performed by using a correlation coefficient algorithm. A similarity algorithm is selected herein for a brief description, but should not be considered as a limitation to the technical solutions of the present invention. Other similarity algorithms employed by a person of ordinary skill in the art shall fall within the protection scope of the present application.

A case in which a Pearson correlation coefficient algorithm is employed for similarity verification is used as an example, where the algorithm is defined as follows:

A Pearson correlation coefficient describes the closeness of a relation between two interval scale variables, and is used to measure a correlation (linear correlation) between two variables X and Y, and falls between −1 and 1, and is generally denoted by r, and a calculation formula is $$r_{xy} = \frac{n \sum XY - \sum X \sum Y}{\sqrt{[n \sum X^2 - (\sum X)^2][n \sum Y^2 - (\sum Y)^2]}},$$

where n is a sample size, and X and Y are respectively observed values of two variables.

If r>0, it indicates that the two variables are positively correlated, that is, as a value of one variable increases, a value of the other variable increases; if r<0, it indicates that the two variables are negatively correlated, that is, as the value of one variable increases, the value of the other variable decreases instead. A larger absolute value of r indicates a stronger correlation.

Effects of the algorithm in identification of a voltage characteristic similarity are verified through experiments and tests.

Figure 1:
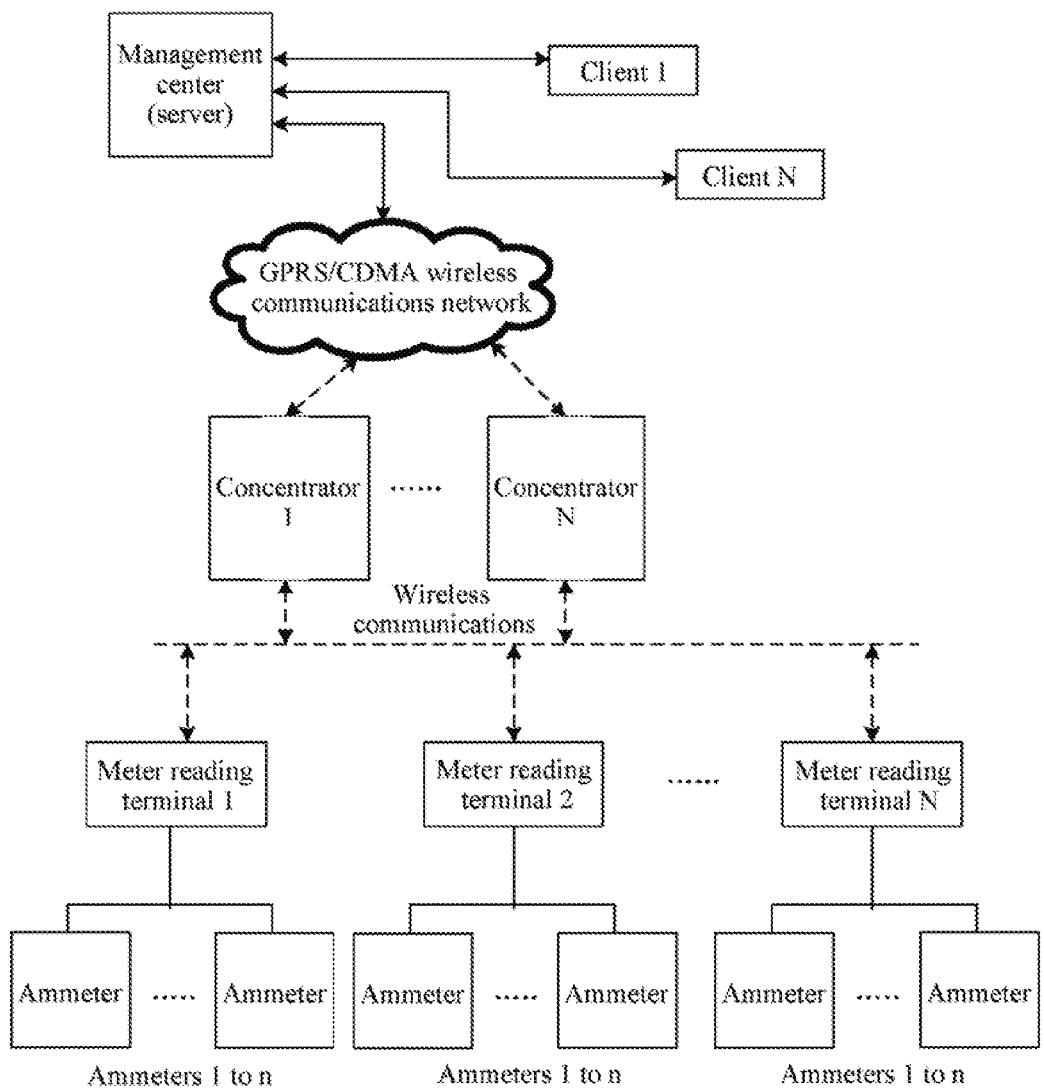
FIG. 1 is a block diagram of a wireless centralized meter reading system.

Voltage curve data of one concentrator and 30 ammeters is collected, and whether an ammeter belongs to a current power distribution area is verified according to a Pearson correlation coefficient. Similarities (positive correlation) between the voltage data of the concentrator and the voltage data of the ammeters are calculated, and the obtained data correlation coefficients are shown in FIG. 1 and FIG. 2.

TABLE 1

Results of similarities calculated for the former 15 ammeters by using the two types of voltage data according to the algorithm

| Algorithm | Ammeter | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| 1 | 0.92 | 0.95 | 0.91 | 0.89 | 0.94 | 0.90 | 0.88 | 0.91 | 0.82 | 0.93 | 0.90 | 0.85 | 0.88 | 0.86 | 0.91 |

TABLE 2

Results of similarities calculated for the latter 15 ammeters by using the two types of voltage data according to the algorithm

| Algorithm | Ammeter | | | | | | | | | | | | | | |
|---|---|---|---|---|---|---|---|---|---|---|---|---|---|---|---|
| | 16 | 17 | 18 | 19 | 20 | 21 | 22 | 23 | 24 | 25 | 26 | 27 | 28 | 29 | 30 |
| 1 | 0.2 | 0.15 | 0.26 | 0.3 | 0.12 | 0.14 | 0.19 | 0.35 | 0.33 | 0.25 | 0.36 | 0.38 | 0.21 | 0.35 | 0.27 |

Power distribution areas to which the foregoing 30 ammeters actually belong are shown in table 3.

TABLE 3

Power distribution areas to which the 30 ammeters actually belong

| | Ammeter | | | | | | | | | | | | | | |
|---|---|---|---|---|---|---|---|---|---|---|---|---|---|---|---|
| | 1 | 2 | 3 | 4 | 5 | 6 | 7 | 8 | 9 | 10 | 11 | 12 | 13 | 14 | 15 |
| Power distribution area | 1 | 1 | 1 | 1 | 1 | 1 | 1 | 1 | 1 | 1 | 1 | 1 | 1 | 1 | 1 |

| | Ammeter | | | | | | | | | | | | | | |
|---|---|---|---|---|---|---|---|---|---|---|---|---|---|---|---|
| | 16 | 17 | 18 | 19 | 20 | 21 | 22 | 23 | 24 | 25 | 26 | 27 | 28 | 29 | 30 |
| Power distribution area | 2 | 2 | 2 | 2 | 2 | 2 | 2 | 2 | 2 | 2 | 2 | 2 | 2 | 2 | 2 |

It can be seen by comparison with the power distribution areas to which the 30 ammeters actually belong that, the ammeters are correctly allocated to different power distribution areas by using the Pearson correlation coefficient algorithm. It can further be seen that, when a set value is selected as any value within the range 0.6 to 0.8, allocation of the 30 ammeters to power distribution areas are all correct, and accuracy of power distribution area allocation reaches up to 100%.

Although the present invention is described with reference to the accompanying drawings and the preferred examples, various modifications and variations may be made to the present invention by a person of skill in the art. The various modifications and variations to the present invention and equivalents thereof are covered by the content of the accompanying claims.

What is claimed is:

1. A method for differentiating power distribution areas and phases by using voltage characteristics, comprising: performing similarity comparison on a voltage curve of a node to be determined and a voltage curve recorded by a concentrator to determine whether the node belongs to a current power distribution area, including the following specific steps:

step a: a concentrator continuously collects a voltage curve of a node to be determined and stores the voltage curve;

step b: perform similarity comparison on a voltage curve recorded by the concentrator and the voltage curve obtained in step a;

step c: if a similarity absolute value is greater than a set value, determine that the node belongs to a current power distribution area, and if the similarity absolute value is less than or equal to the set value, kick out the node so that the node becomes a free node; and step d: repeat steps a to c, until all nodes to be determined are traversed.

2. The method for differentiating power distribution areas and phases by using voltage characteristics according to claim 1, wherein the method further comprises:

step e: search for a free node, and perform similarity comparison with the voltage curve recorded by the concentrator;

step f: if a similarity absolute value is greater than the set value, determine that the node belongs to the current power distribution area, and if the similarity absolute value is less than or equal to the set value, kick the node into a free node library; and step g: repeat steps e to f, until all free nodes are traversed.

3. The method for differentiating power distribution areas and phases by using voltage characteristics according to claim 2, wherein a method for the similarity comparison uses a Pearson correlation coefficient algorithm.

4. The method for differentiating power distribution areas and phases by using voltage characteristics according to claim 3, wherein the set value is 0.6 to 0.8.

5. The method for differentiating power distribution areas and phases by using voltage characteristics according to claim 4, wherein the set value is 0.8.

6. The method for differentiating power distribution areas and phases by using voltage characteristics according to claim 1, wherein a method for the similarity comparison uses a Pearson correlation coefficient algorithm.

7. The method for differentiating power distribution areas and phases by using voltage characteristics according to claim 6, wherein the set value is 0.6 to 0.8.

8. The method for differentiating power distribution areas and phases by using voltage characteristics according to claim 7, wherein the set value is 0.8.

* * * * *